US006413867B1

(12) United States Patent
Sarfaty et al.

(10) Patent No.: US 6,413,867 B1
(45) Date of Patent: Jul. 2, 2002

(54) FILM THICKNESS CONTROL USING SPECTRAL INTERFEROMETRY

(75) Inventors: Moshe Sarfaty, Cupertino; Lalitha S. Balasubramhanya, Sunnyvale; Jed E. Davidow, Santa Clara; Dimitris P. Lymberopoulos, San Jose, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/470,828

(22) Filed: Dec. 23, 1999

(51) Int. Cl.⁷ ...................... H01L 21/302; H01L 21/461
(52) U.S. Cl. ...................................................... 438/689
(58) Field of Search ......................................... 438/689

(56) References Cited

U.S. PATENT DOCUMENTS

| | | | | |
|---|---|---|---|---|
| 4,602,981 A | * | 7/1986 | Chen et al. | 156/627 |
| 5,450,205 A | | 9/1995 | Sawin et al. | |
| 5,807,761 A | | 9/1998 | Coronel et al. | |
| 5,846,373 A | * | 12/1998 | Pirkle et al. | 156/345 |
| 5,926,690 A | | 7/1999 | Toprac et al. | |
| 6,018,334 A | | 1/2000 | Eckerberg et al. | |
| 6,052,176 A | | 4/2000 | Ni et al. | |
| 6,136,712 A | * | 10/2000 | Klippert et al. | 438/692 |
| 6,148,239 A | | 11/2000 | Funk et al. | |
| 6,160,621 A | * | 12/2000 | Perry et al. | 356/381 |
| 6,190,927 B1 | | 2/2001 | Liu | |
| 6,245,581 B1 | | 6/2001 | Bonser et al. | |

OTHER PUBLICATIONS

K.P. Killeen et al., "In Situ Spectral Reflectance Monitoring of III–V Epitaxy," *Journal of Electronic Materials*, vol. 23, No. 2, pp. 179–183 (1994).

R. Laaksonen, "Full Wafer Interferometric Measurements of Etch Rate and Thickness Uniformity," *Semiconductor International*, pp. 277–286 (Jul. 1997).

I. Tepermeister et al., "In Situ Monitoring of Product Wafers," *Solid State Technology*, pp. 63–67 (Mar. 1996).

K. Wong et al., "Endpoint Prediction for Polysilicon Plasma Etch Via Optical Emission Interometry,"*J. Vac. Sci. Technol. A*, vol. 15, No. 3, pp. 1403–1408 (May/Jun. 1997).

B. Manly, "Principal Components Analysis," *Multivariate Statistical Methods,* A Primer, Second Edition, Chapman & Hall, Chapter 6. pp. 76–92.

* cited by examiner

*Primary Examiner*—Felisa Hiteshew
(74) *Attorney, Agent, or Firm*—Townsend and Townsend Crew; Joseph Bach

(57) ABSTRACT

A process for controlling a substrate processing operation such as a plasma etch operation. One embodiment of the method of the present invention forms a plasma within a substrate processing chamber to etch a wafer disposed within the chamber. The plasma emission is used by the process as a broadband light source. During the plasma etch process, a plurality of wavelengths of radiation reflected from the surface of the wafer being etched are measured with a spectrometer. These measurements are then compared using pattern recognition techniques to previous measurements taken during a previous plasma etch operation. Certain embodiments of the invention use principal component analysis (PCA) techniques to perform pattern recognition while other embodiment use programmed neural net pattern recognition techniques.

17 Claims, 7 Drawing Sheets

(2 of 7 Drawing Sheet(s) Filed in Color)

FILM THICKNESS CONTROL USING SPECTRAL INTERFEROMETRY

BACKGROUND OF THE INVENTION

The present invention relates to a technique for monitoring film thickness including a method of controlling etch and deposition processes. One specific embodiment of the present invention relates to a method of controlling and detecting the end point in a plasma etch process by using the plasma emission as a broadband light source and measuring the radiation reflected off the wafer being etched with a spectrometer. The present invention may be used to control a variety of plasma and non-plasma processes and is particularly useful in controlling plasma etch processes used in the manufacture of integrated circuits.

Etching one or more layers of a semiconductor substrate in a plasma etch environment is one of the most common steps in the manufacture of integrated circuits. Typical plasma etch processes in semiconductor manufacturing are controlled and stopped either as a timed process or by relying on an end point detection (detection of the time at which the film being etched is completely removed) technique that monitors the optical emission lines of certain species in the plasma.

As new generations of integrated circuits employ smaller feature sizes than were contemplated in previous generations, greater demands are placed on the fabrication process. These demands include being able to precisely control the timing of plasma etch processes. For example, one common process used to etch a polysilicon gate structure includes three separate steps. The first step removes a top oxide layer that may have formed over the polysilicon, the second step etches the bulk of the polysilicon at a relatively high etch rate to increase wafer throughput and the third step switches to a slower, but more selective (relative to the underlying oxide layer) final etch.

To preserve the integrity of the underlying gate oxide layer (which may be less than 25 Å thick) in such an etch, it is necessary to have an endpoint prediction technique that triggers a process switch to obtain high selectivity to the gate oxide near the end of the plasma etch. Because of variations from one etching step to another, a timed etch may result in under- or over-etching of the polysilicon layer. Similarly, employing an endpoint detection technique that monitors optical line emissions relies on exposing the underlayer (i.e., the gate oxide in this example) to the plasma etch chemistry. Such exposure can degrade the integrity of the gate oxide layer. Thus, to avoid underlayer exposure to the plasma environment, an endpoint prediction technique that directly monitors the wafer state is required.

One process that has been developed to meet this requirement is an interferometric endpoint (IEP) detection system. The IEP system uses a mercury (Hg) lamp that generates a strong Hg atomic line emission that is coupled to a bifurcated optical fiber. A collimating lens and folding mirror set at the output end of the fiber illuminates a spot diameter of approximately 1 cm in diameter on the wafer through a sapphire window mounted on the top of the dome. The light reflected from the wafer is coupled back to the second arm of the bifurcated fiber and measured by a single wavelength optical detector, such as a photomultiplier or photodiode. The single wavelength optical signal shows optical fringes as the thickness of the top layer film is etched away. For weakly or non-absorbing films fringe counting can be used for etch rate measurements and etch-to-depth prediction. However, some films have higher absorption and the fringes will be observed only below a certain film thickness. Currently, the single wavelength detection limits the IEP system to the existing Hg lines, usually the useful lines are 254, 313, 365, 405 and 435 nm. As device features shrink it is more advantageous to use shorter wavelengths (UV) lines that can better resolve thinner films. Moreover, film properties such as spectral dependent absorption may require the use of optical lines other than those available by Hg lamp.

Another technique that has been developed to detect the endpoint of plasma etch processes uses a CCD camera with appropriate sensors, filters, optics and software to monitor the reflection of a single wavelength of radiation from numerous spots on the wafer. This technique can be used to determine the etch rate of an etch process by examining and comparing the timing of two or more fringes. The technique cannot directly determine film thickness and instead can be used to estimate thickness based on the thickness of the film as deposited and the measured etch rate.

In a different technique that has been employed to monitor the growth of epitaxial films, multiple wavelengths of radiation reflected off the wafer are measured with a spectrograph. The technique then creates a model of film growth based on optical constants such as the refractive index of the film to account for film thickness, growth rates, etc. This technique requires that separate models, which can be quite extensive, be developed for controlling different processes and even variations in final film thickness, temperature conditions, etc. of a same process. The models become even more complicated when taking signal variations due to wafer patterns into account.

Accordingly, new techniques to in situ monitor film thickness in etching and deposition processes are desirable.

SUMMARY OF THE INVENTION

The present invention provides an improved technique to monitor film thickness including an improved plasma etch monitoring and endpoint prediction technique. One embodiment of the invention uses the plasma emission of the etch process as a broadband light source and measures the reflectance off the wafer with a spectrometer. A plurality of the measured wavelengths are then compared using pattern recognition techniques to previous measurements taken during an earlier, preferably pre-production calibration run to control the plasma etch process. The previous measurements act as "fingerprints" of a particular process for a particular integrated circuit design that can be subsequently compared to data measured from the same process performed on a subsequent wafer used in the manufacture of the same integrated circuit design. The fingerprints can be taken at various times of the etch process and used as check points to time the process by identifying when the thickness of the production film matches the thickness of the calibration process film at a previously identified point. Once the "matching" thickness is found, actions such as altering the process chemistry or stopping the process altogether when its endpoint is reached can be taken. Other embodiments monitor and control the thickness of a deposited film, and some embodiments measure the reflectance of radiation off the surface of the wafer generated by a light source other than the plasma emissions, e.g., a mercury, deuterium or xenon lamp.

One particular embodiment of the method of the present invention uses principal component analysis (PCA) techniques to perform the pattern recognition comparison. PCA basically transforms the input variables to a set of orthogonal vectors, referred to as principal components (PCs), which is linear combination of the original variables. The technique capitalizes on the fact that very often many parameters are correlated. The PC vectors (eigenvectors) are ordered by their eigenvalues. Typically two PC vectors capture more than 90% of the variations in the signals, therefore, minimizing the dimensionality of the system. Another embodiment of the invention uses programmed neural net pattern recognition techniques.

These and other embodiments of the present invention, as well as its advantages and features, are described in more detail in conjunction with the text below and attached figures.

BRIEF DESCRIPTION OF THE DRAWINGS

The file of this patent contains at least one drawing executed in color.

DESCRIPTION OF THE SPECIFIC EMBODIMENTS

I. An Exemplary Plasma Etch System Configured to Practice the Present Invention

Figure 1:
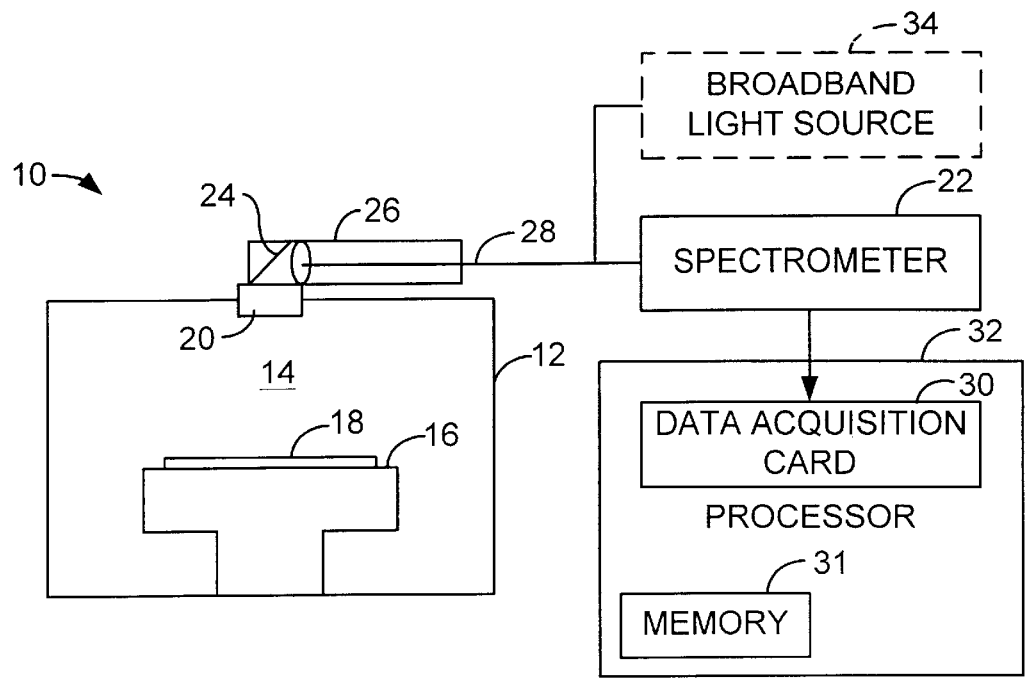
FIG. 1 is a simplified cross-sectional view of an exemplary plasma etch chamber configured to practice the method of the present invention.

The method of the present invention can be used with any standard plasma etch chamber in which a spectrometer or other type of radiation collector can be either placed within the chamber to measure radiation reflected off the surface of the wafer or that includes a window or viewport through which such radiation can be directed to a spectrometer positioned outside the chamber. FIG. 1 is a simplified crosssectional view of an exemplary plasma etch chamber 10 configured to practice the method of the present invention. As shown in FIG. 1, etch chamber 10 includes a housing 12 that surrounds a substrate processing region 14. During an etch process a substrate 18 is supported on a pedestal 16 and exposed to a plasma formed in region 14. The plasma generates electromagnetic radiation that includes emissions having wavelengths in the optical spectrum (i.e., from about 180 to 1100 nm). A portion of these emissions are reflected off the surface of substrate 18 and through a window 20 so they can be measured by spectrometer 22. A folding mirror 24 reflects the radiation that passes through window 20 towards a lens 26 that collimates the radiation into a fiber optic cable 28. Fiber optic cable 28 is the vehicle through which the radiation travels to reach spectrometer 22. Folding mirror 24 and lens 26 are positioned so that radiation reflected from the upper surface of substrate 18 passes through window 20 vertically into optical fiber 28. Placement of window 20 above substrate 18 as shown in FIG. 1 allows better resolution of the measured radiation as opposed to placement of the window on the side of the chamber but other embodiments may position window 20 on the chamber side. In embodiments that employ a broadband light source 34 in addition to or instead of the plasma emission, fiber optic cable 28 is a bifurcated cable. In these embodiments, light source 34 is optically coupled to one of the channels of bifurcated cable 28 and spectrometer 22 is coupled to the other channel. Light from broadband light source 34, e.g., a mercury, deuterium or xenon lamp, travels along one channel of cable 28 through window 20 and is reflected off substrate 18. The reflected light passes through window 20 into the other channel of cable 28 as described above before finally reaching spectrometer 22.

Spectrometer 22 spectrally separates radiation based on wavelength (e.g., via a prism or diffraction grating (not shown)), and generates detection signals (e.g., detection currents) for a plurality of the spatially separated wavelengths. A data acquisition card 30 coupled to a processor 32 collects data representing the separated wavelengths at a periodic sampling rate. In one embodiment processor 32 also controls the operation of chamber 10 by executing computer instructions stored in a memory 31 coupled to the processor.

In a current embodiment, spectrometer 22 spatially separates the radiation wavelengths onto a 2048 linear silicon charge-coupled device (CCD) array. The CCD array generates 2048 detection currents or 2048 "channels" of detection signal information (i.e., optical emission spectroscopy (OES) information) for radiation wavelengths from about 180–870 nanometers. In this embodiment, data acquisition card 30 periodically samples the CCD's output at a rate of 1 MHz and converts the sampled signals into 12-bit digital data.

II. Description of a Calibration Process According to the Present Invention

In order to monitor a process according to the present invention, spectral interference measurements need to be taken from a previous process. This previous process is typically, but not necessarily, a pre-production run process and is referred to herein as a calibration process. Successfully monitoring and controlling a plasma etch process according to the method of the present invention depends on identifying matches between measurements taken from the calibration process and measurements taken during the process being monitored and controlled. Factors such as process chemistry, chamber pressure, substrate temperature and substrate topology among others, effect the spectral interference measurements taken during both the calibration process and monitored/controlled processes. Accordingly, the process conditions of the calibration process should match those of the monitored/controlled process as closely as possible. In some embodiments this includes performing the calibration measurements on a substrate having similar topology to that of the substrate processed during the monitored/controlled process. For example, if the process being controlled is a via etch to an underlying metal layer, having an ARC, an oxide layer and patterned photoresist layer deposited over the metal layer in order from bottom to top, the calibration process should also be performed on a substrate that has a similarly patterned photoresist layer deposited over a similar oxide layer to reproduce a topology substantially similar to the topology of the monitored/controlled process.

Figure 2:
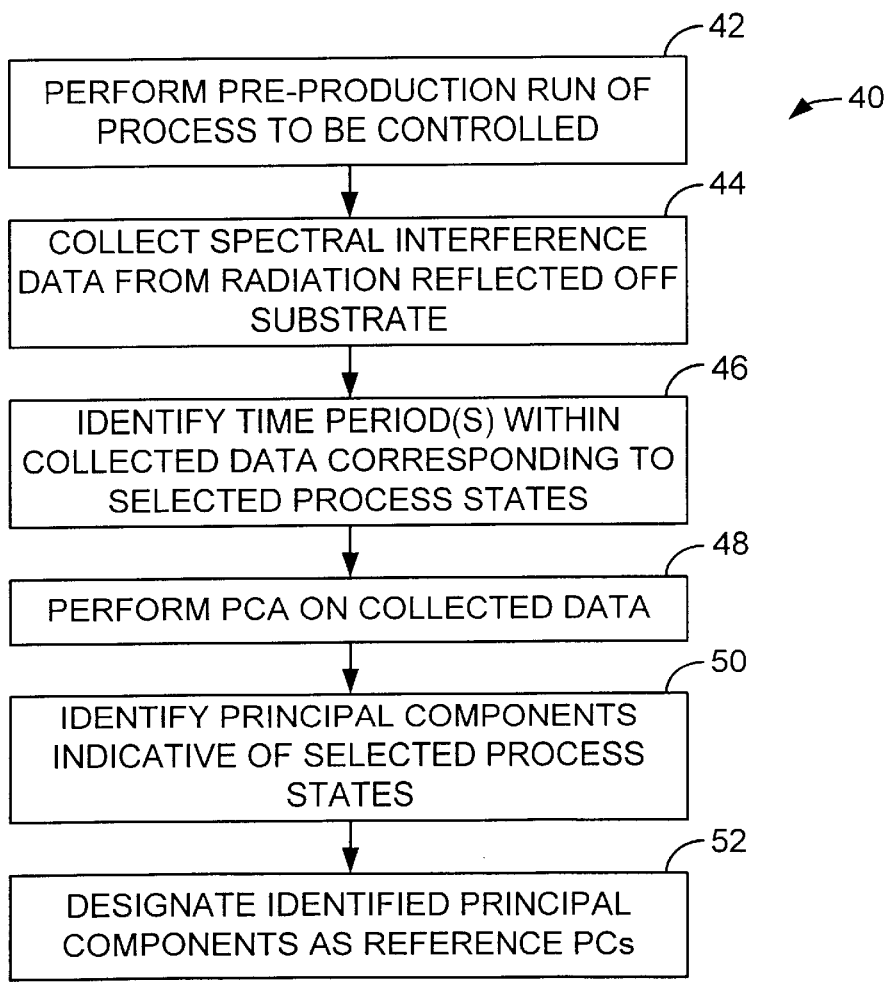
FIG. 2 is a flowchart illustrating the steps involved in a calibration process according to an embodiment of the present invention that uses principal component analysis (PCA) techniques for pattern recognition.

FIG. 2 is a flowchart illustrating the steps involved in a calibration process 40 according to an embodiment of the present invention that uses principal component analysis (PCA) techniques to detect desired events or points within a subsequently monitored/controlled process. As previously mentioned, other embodiments of the invention may employ pattern recognition techniques other than PCA techniques. These other pattern recognition techniques, for example neural net techniques, will include calibration processes appropriate for the given pattern recognition technique.

As shown in FIG. 2, calibration process 40 starts by performing a pre-production run of the process that will be subsequently monitored and controlled using the techniques (e.g., a semiconductor plasma etch process) of the present invention (step 42). During the entire length of the pre-production run, data is periodically collected (e.g., at 1 MHz) by data acquisition card 30 (step 44). The collected data is stored within a memory (e.g., a hard disk) of processor 32.

After completion of the pre-production run of the process to be monitored, one or more time periods are identified within the collected data that correspond to a film thickness to be identified in the calibration process (step 48). This time or time period identification typically is performed following the calibration process and may therefore be conducted using sophisticated, albeit time consuming, identification techniques not suitable for real-time use during a process, such as an oxide etch for a contact opening of a semiconductor device. For example, if the calibration process is an etch process, the endpoint or breakthrough time for etching a material layer (the point at which the thickness of the layer is zero) may be determined by performing a series of different duration etches under identical process conditions and by examining the cross section (e.g., via scanning electron or transmission electron microscopy techniques) of the material layer for each etch duration to determine and verify the precise endpoint or breakthrough time for the etching of the material layer.

Next, principal component analysis (PCA) is performed on the collected data for the calibration process collected near the identified time period(s) that correspond to selected process events (step 48). For example, a window of data (e.g., a window comprising data for ten different measurement times, or any other window size) comprising collected data taken at times before, during and/or after the event can be examined. The collected data within the window is used to form a matrix having rows comprising the measured correlated attribute data and columns comprising the time each attribute set was measured. The data within the matrix may be analyzed as collected but preferably is mean centered (as described below). Thereafter a singular value decomposition is performed on the matrix and principal component eigenvectors are generated for the collected data within the matrix.

After the principal component eigenvectors are generated, the principal eigenvectors for each identified time period are associated with film thickness measured in the calibration process. As described below, typically one principal component will contain a sharp feature indicative of the particular thickness (step 50). The identified principal component is then designated as a "reference" principal component for the identified thickness (step 52). As described below, once obtained, the reference principal component may be used during the performance of a production process (e.g., in real time) to rapidly identify when the process reaches the selected thickness. To be used for such real time process control, the reference principal components may be stored in a memory, such as memory 31, that is accessible to processor 32.

III. Controlling a Deposition or Etch Process According to the Present Invention Once the calibration data has been collected and the reference principal component for each appropriate process control point identified, the method of the present invention can be used to monitor and control deposition and etch processes. Control of the process can be in the form of modifying the process chemistry when the process reaches an appropriate control point or stopping the process at a control point. For example, in the case of a deposition process detection of a particular film thickness can be used to stop film deposition or modify deposition parameters, (e.g., alter the deposition-to-etch ratio of the film or switch from a deposition chemistry to deposit a gapfill layer to a chemistry to deposit a capping layer, among other actions). Similarly, for an etch process, detection of a particular film thickness can be used to stop the etch process, modify the etch chemistry or take other appropriate action as determined by the thickness of the film at the selected thickness point.

Figure 3:
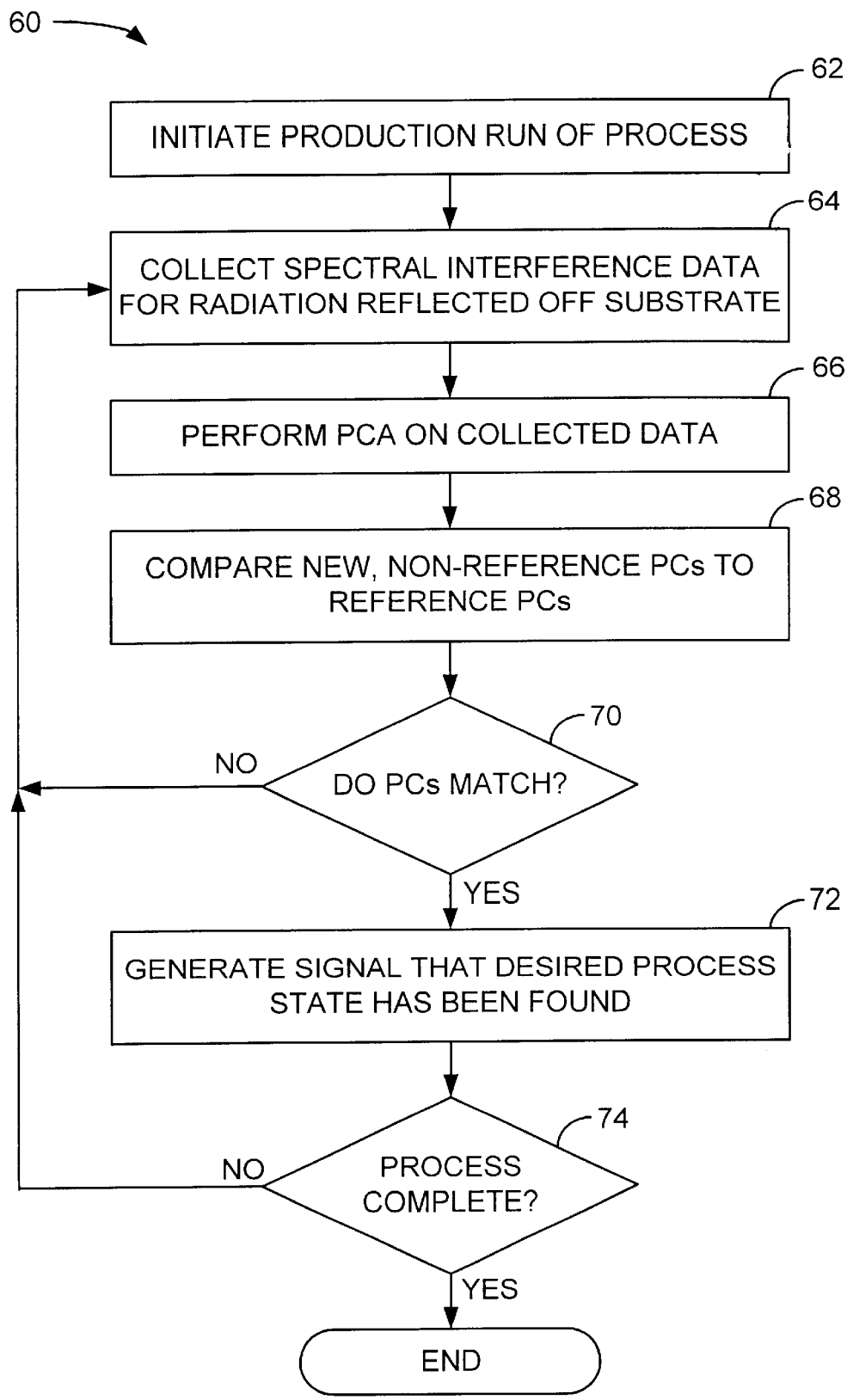
FIG. 3 is a flowchart illustrating the steps of a method 60 for controlling a plasma etch production process according to one embodiment of the present invention.

FIG. 3 is a flowchart illustrating the steps of a method 60 for controlling a plasma etch production process according to one embodiment of the present invention. Method 60 can be implemented under the control of computer processor 32. The production process is performed with essentially the same process parameters as the calibration process (step 62). During the production process, spectral interference measurements are taken by spectrometer 30 (step 64) and stored within an evolving window wherein new collected data is added to the window and old data dropped from the window over time until all collected spectral interference data passes through the window. The evolving window for the production process is preferably, but not necessarily, the same size as the window used to compute reference principal components for the calibration process.

Each time new spectral interference data is added to the evolving window, principal component analysis is performed on the data therein to generate one or more principal components for the production process (e.g., one or more non-reference principal components). Alternatively, principal component analysis may be performed only near the expected time for the desired film thickness (step 66).

Each non-reference principal component is compared to the reference principal component (step 68). The non-reference and reference principal components may be compared by any method (e.g., subtraction, subtraction followed by a norm operation, division, with a coherence-type function, etc.) but preferably are compared by computing the inner product of the two principal components. Because the two principal components have unit length, the inner product of the reference and non-reference principal components is approximately +1.0 if the reference and non-reference principal components have approximately the same features that change in the same directions, is approximately −1.0 if the reference and non-reference principal components have approximately the same features but in opposite signs and is approximately zero if the reference and non-reference principal components are orthogonal. Thus, by taking the inner product of the reference and non-reference principal components, the non-reference principal component can be easily compared to the reference principal component.

A determination is then made as to whether the reference and non-reference principal components are approximately the same (step 70). If so, a signal is generated indicating that the desired film thickness has been found during the production process (step 72) so that appropriate action (e.g., change in process chemistry or stop process altogether) can be taken.

If the reference and non-reference principal components are determined not to match, additional correlated attributes are measured for the production process and the additional measured correlated attributes are added to the evolving window (steps 64 et al.). Optionally, a step can be put in the process (not shown) so that if after step 70 a match between the reference and non-reference principal components is not found a determination is made as to whether the process has proceeded longer than expected (e.g., timed-out) and if so, the process can be stopped.

IV. Use of the Present Invention to Control of an Exemplary Polysilicon Etch Process In order to better understand and appreciate the method of the present invention, examples of the method used to control a polysilicon etch process are presented below. These examples are for illustrative purposes only and should not be considered as limiting to the claims. In the examples, the plasma etch process etches a polysilicon layer deposited over a thin oxide layer. Spectrometer 22 monitors a broad spectral range (from 180–875 nm) and detects interference fringes across the entire spectral range.

Figure 4:
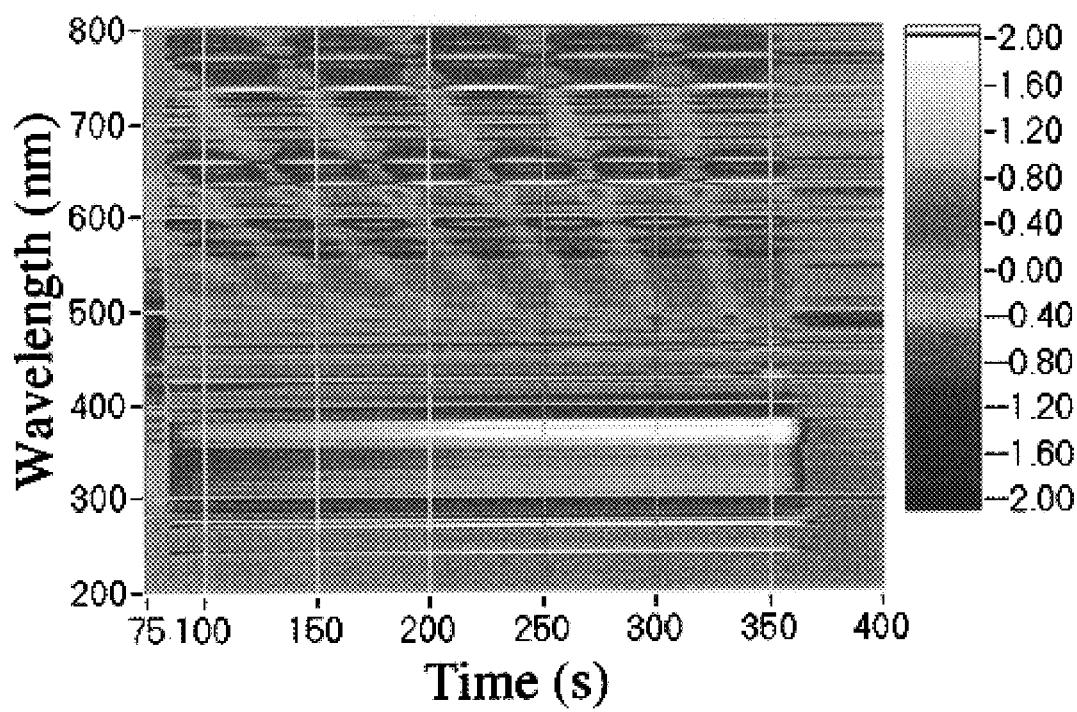
FIG. 4 shows the time-dependent optical emission spectra for the polysilicon etch process.

FIG. 4 shows the time-dependent optical emission spectra for one particular polysilicon etch process. The x-axis in FIG. 4 represents the time at which the spectral interference data was collected, the y-axis spans a spectral range between 180–875 nm and the color-scale represents the changes in the intensity of the plasma optical emission relative to its time average intensity. Data for the color scale was calculated by converting the analog output of the CCD array in spectrometer 22 into a 12-bit digital signal. The time average intensity of the signal for each wavelength was then determined and colors assigned to represent measured values relative to the time averaged intensity, i.e., the variation from mean.

The calculations and color assignments were all made using Labview™ software distributed by National Instruments. The pattern seen in FIG. 4 corresponds to the spectral interference fringes as the polysilicon film is etched away. The fringe spacing depends on the observed wavelength and on the wavelength-dependent index of refraction of the film.

The complete clearing of the film in FIG. 4 occurs at approximately 360 seconds, where the fringes are absent from the traces. The plasma emission in this case is broadband, bright and stable enough to obtain these multiple wavelengths fringes. The change of the fringes' intensity is related to the etch-rate and the remaining film thickness.

Figure 5:
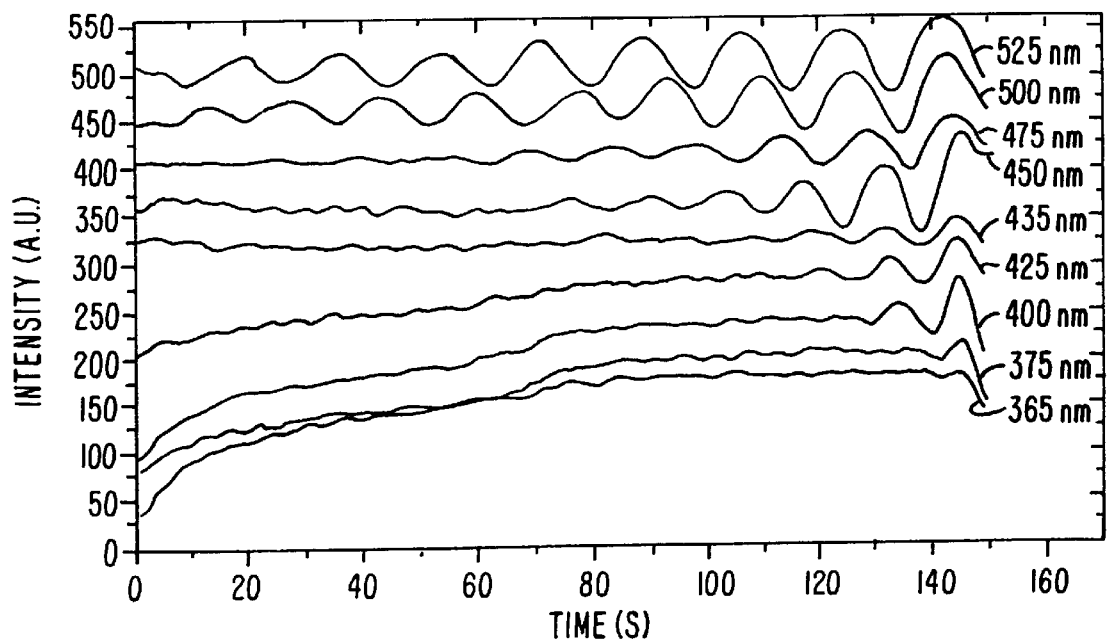
FIG. 5 is a graph plotting the intensity of a subset of radiation wavelengths from 365 nm to 525 nm over time.

FIG. 5 is a graph plotting the intensity of a subset of radiation wavelengths from 365 nm to 525 nm over time. The periodicity of the fringes corresponds to the etch rate and as is already known to those skilled in the art can be calculated using a FFT algorithm. Furthermore, as already known, the multiple wavelength information can be used to calculate both the absolute thickness of the film and the remaining film thickness. The absolute thickness of the film can be calculated using the known dependence of the film's index of refraction and extinction, n and k, respectively. Finally, as is also known, the phase relation between the different fringes as a function of wavelength can be interpreted as film thickness. The information on the remaining film thickness can be gathered from the appearance of fringes as a function of wavelength. The reflected signal from the film depends on the film's spectral absorption and the film thickness, as shown in FIG. 5. The shorter wavelengths are absorbed more than the long wavelengths, therefore, the blue and UV fringes are observed later in time relative to the red lines.

Figure 6E:
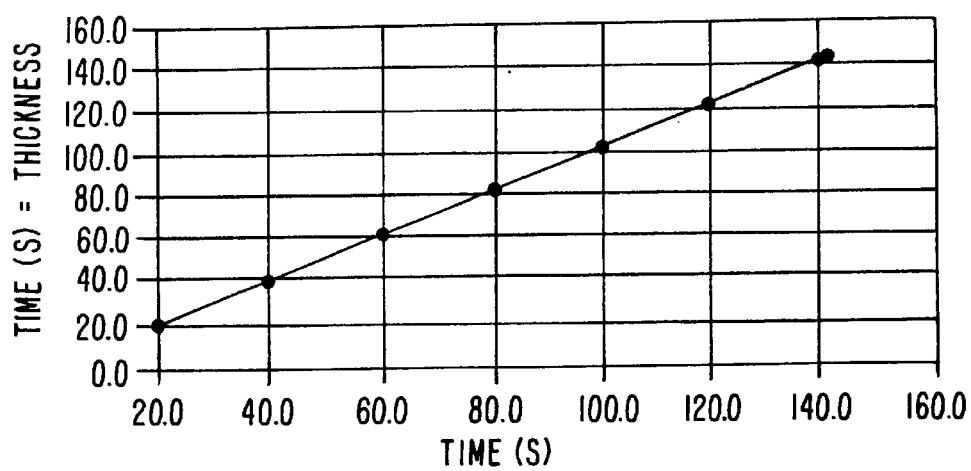
FIGS. 6A–6E illustrate examples of the method of the present invention used to detect previously identified film thickness of a polysilicon etch process.
Figure 6A:
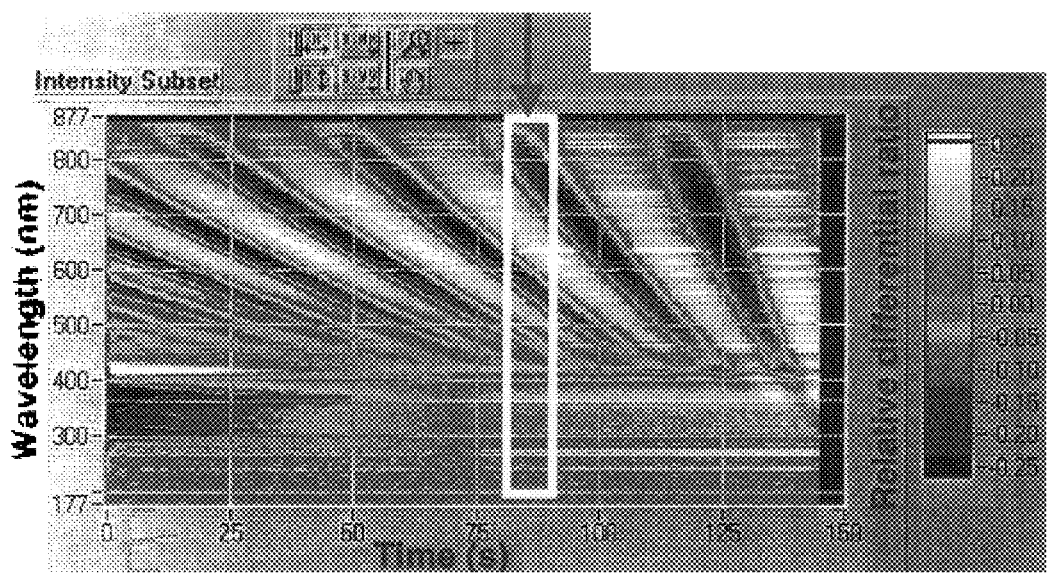
Figure 7A:
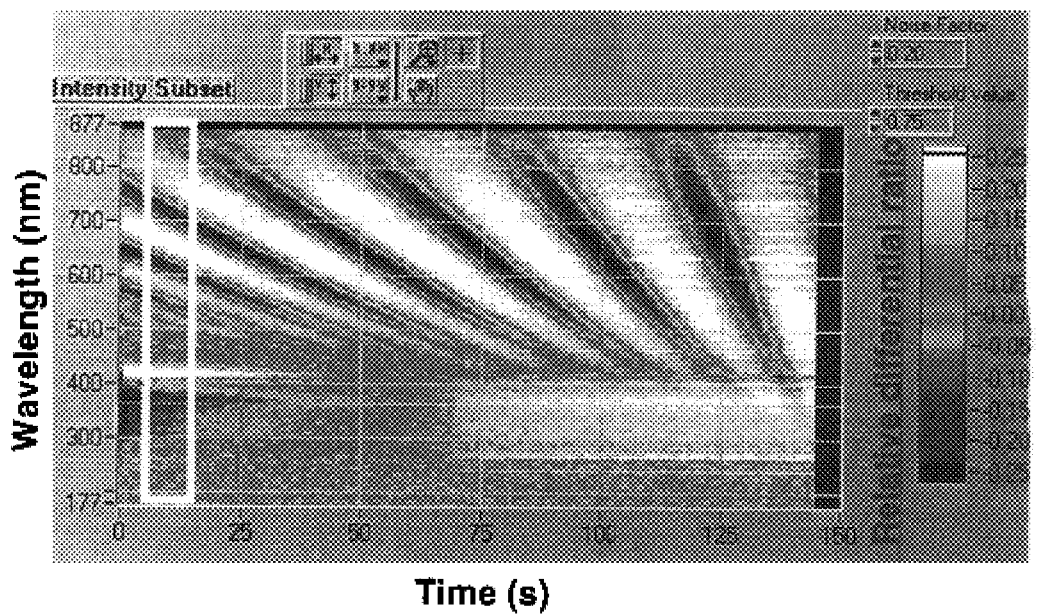
FIGS. 7A–7D illustrate examples of the method of the present invention used to detect previously identified film thickness of a polysilicon etch process when a random noise level of up to 20% is added to the measured radiation.

As previously discussed, the method of the present invention provides a different technique to monitor film thickness than those discussed above with respect to FIG. 5. The method of the invention is based on a on a pattern recognition algorithm on spectral interference data. An example of a principal component analysis algorithm employing a 10 second window to pick up the major changes in the interference spectra as presented using the Labview™ software is shown in FIG. 6A. It is worth noting that the color scale in FIG. 6A represents a fraction differential change in intensity of a measured wavelength relative to the average intensity of the reflected radiation.

Figure 6B:
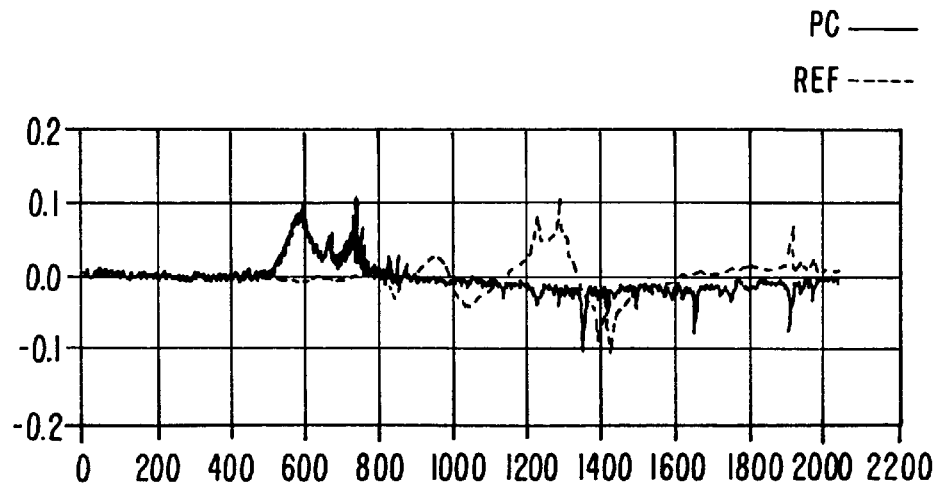

The full spectral interference pattern over the measured spectral range changes with the variations in the deposited/etched film thickness. Thus, running a PCA on different time segments of the deposition or etch training run can be used to build-up a set of reference PC vectors that relate to known film thicknesses. These reference PC vectors, at different times, are the film thickness references. An example of a second PC vector (PC2) is shown in FIG. 6B. The reference PC2 (Ref2) was calculated at 80 seconds and the running PC2 (i.e., the PC2 calculated during the polysilicon etch process) at 50 seconds. The x-axis corresponds to the CCD pixel number or wavelength and the y-axis corresponds to the weight associated with each wavelength, which specifies the change observed at the specific wavelength.

Figure 6C:
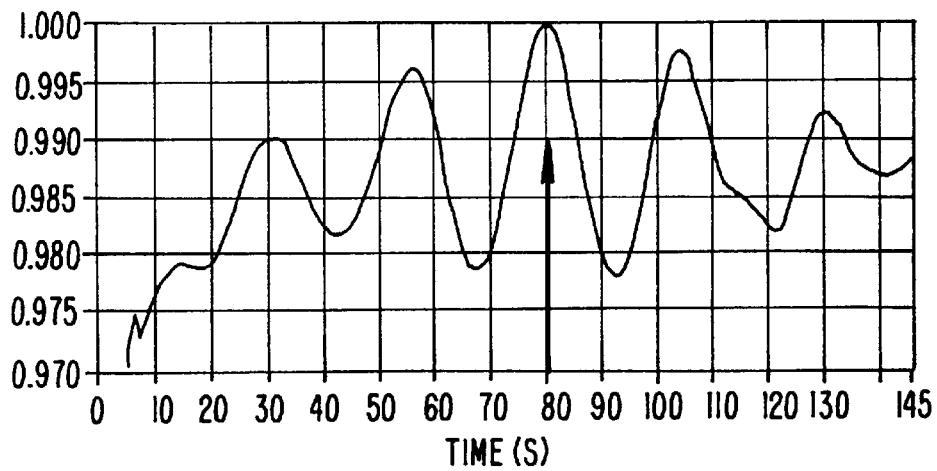
Figure 6D:
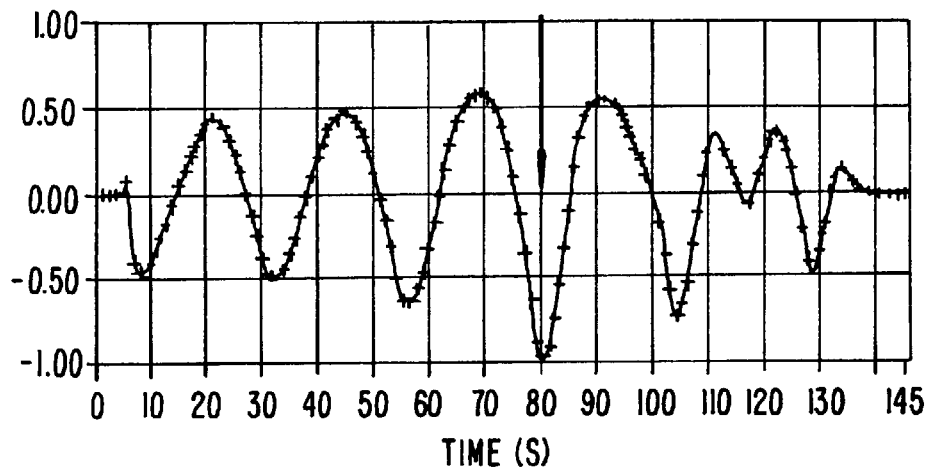

The time dependent or running PC vector is compared to the reference PC vector by carrying and inner product of the two vectors. When the two vectors coincide the value will be unity. FIGS. 6C and 6D show the inner product of the first and second reference PC vectors with the first and second running PC vectors, respectively, as a function of time. When the remaining film thickness of the running polysilicon etch process is different from the thickness of the film remaining at t=80 seconds in the reference process, the inner product is different from one. When at t=80 seconds the inner product is 1.0 for PC1 and −1.0 for PC2, where the sign represents an increase or decrease of the signals, thereby indicating a match. Using several reference vectors at known times or film thickness and comparing the running PCA with these references by carrying inner product calculation and peak detection algorithm enables the film thickness as a function of time to be monitored as shown in FIG. 6E. FIG. 6E shows that for each time during the etch process for which reference principal components were previously generated (times t=20, 40, 60, 80, 100, 120, and 140 seconds), the method of the present invention was able to detect that same time during the production process by comparing the non-reference principle components generated in step 66 to the reference principle components.

Figure 7B:
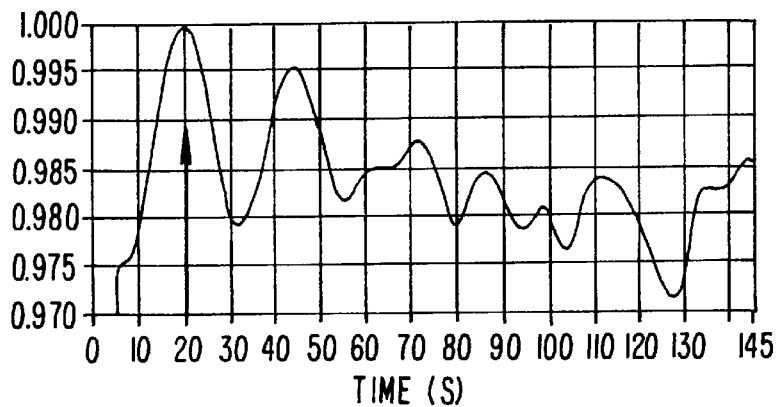
Figure 7C:
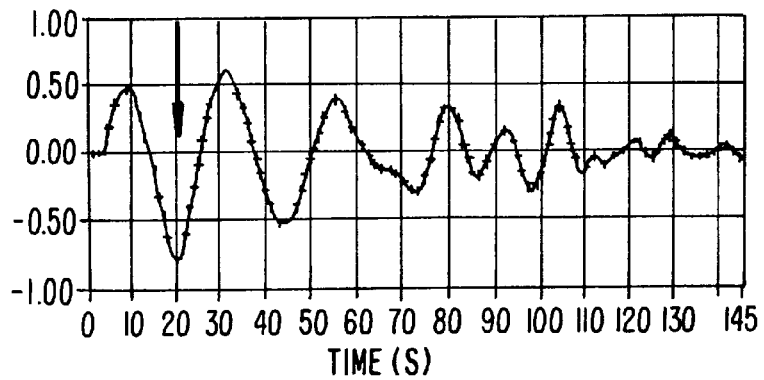
Figure 7D:
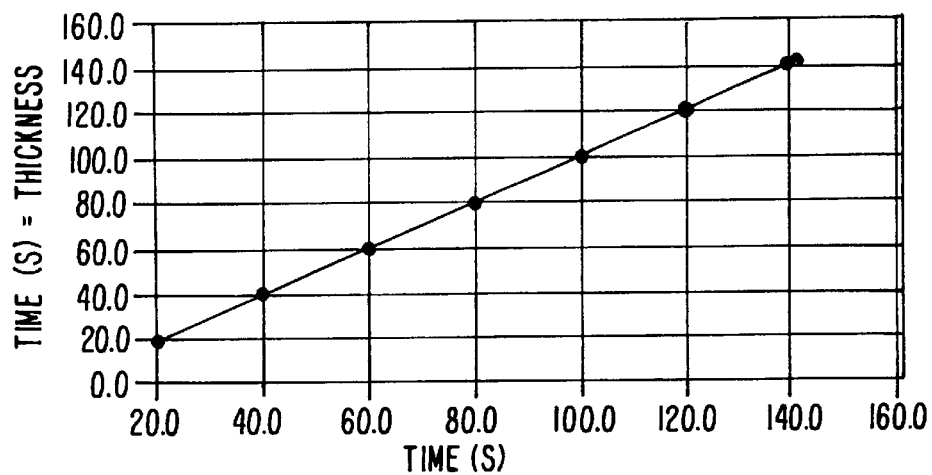

In order to further test the method of the present invention, the inventors carried out the same algorithm discussed above with respect to FIGS. 6A–E using the known reference vectors on a similar data set with random noise of up to 20%. The results of this test are shown in FIGS. 7A–D. Again, FIG. 7D shows that for each of the times for which reference principal components were generated, the method was able to detect the same time during the production process in spite of the inclusion of random noise in the signal measured from the production process proving the robustness of the method of the present invention. FIGS. 7B (inner product of the first reference PC vector with a first running PC vector) and 7C (inner product of the second reference PC vector with a second running PC vector) show that the PCA pattern recognition technique was successful in identifying the correct thickness of the film remaining after the etch process had proceeded for 20 seconds.

Having fully described at least one embodiment of the present invention, other equivalent or alternative methods of controlling a plasma process according to the present invention will be apparent to those skilled in the art. For example, while the present invention was primarily described in conjunction with a plasma etch process, the invention can be used to monitor and control a variety of other plasma processes including both standard and high density plasma enhanced chemical vapor deposition processes among others. The invention can also be used to control non-plasma etch and deposition process (or processes where the plasma is formed remotely) by measuring wavelengths of radiation generated from a broadband lamp or similar light source reflected off the surface of the substrate being processed. Additionally, while the embodiments of the invention described above all collected radiation reflected off the substrate with a spectrometer, alternative devices, such as a photodiode array wherein each photodiode monitors a different wavelength or wavelength spectrum, can be used. These equivalents and alternatives along with the understood obvious changes and modifications are intended to be included within the scope of the present invention.

What is claimed is:

1. A method for controlling operation of a substrate processing chamber, said method comprising:
    transferring a substrate into said substrate processing chamber;
    performing a substrate processing operation on said substrate disposed within said substrate processing chamber;
    measuring a plurality of wavelengths of radiation reflected from an upper surface of said substrate during said substrate processing operation; and
    comparing the measured wavelengths with wavelengths measured during a previous substrate processing operation using a pattern recognition technique and stopping the substrate processing operation in response to a positive comparison.

2. A method for controlling operation of a substrate processing chamber, said method comprising:
    transferring a substrate into said substrate processing chamber;
    performing a substrate processing operation on said substrate disposed within said substrate processing chamber;
    measuring a plurality of wavelengths of radiation reflected from an upper surface of said substrate during said substrate processing operation; and
    comparing the measured wavelengths with wavelengths measured during a previous substrate processing operation using a principal component analysis technique.

3. A method for controlling operation of a substrate processing chamber, said method comprising:
    transferring a substrate into said substrate processing chamber;
    performing a substrate processing operation on said substrate disposed within said substrate processing chamber;
    measuring a plurality of wavelengths of radiation reflected from an upper surface of said substrate during said substrate processing operation; and
    comparing the measured wavelengths with wavelengths measured during a previous-substrate processing operation using a pattern recognition technique; wherein said substrate processing operation forms a plasma within said chamber and said radiation reflected from said upper substrate surface is generated from said plasma.

4. The method of claim 3 wherein said substrate processing operation is a plasma etch operation.

5. The process of claim 4 wherein said plasma etch operation is stopped in response to a positive comparison of said measured plurality of wavelengths to said previously measured wavelengths.

6. The method of claim 4 wherein gas flows of said plasma etch operation are altered in response to a positive comparison of said measured plurality of wavelengths to said previously measured wavelengths.

7. The method of claim 3 wherein said substrate processing operation is a plasma enhanced CVD operation.

8. A method for controlling operation of a substrate processing chamber, said method comprising:
    transferring a substrate into said substrate processing chamber;
    performing a substrate processing operation on said substrate disposed within said substrate processing chamber;
    measuring a plurality of wavelengths of radiation reflected from an upper surface of said substrate during said substrate processing operation; and
    comparing the measured wavelengths with wavelengths measured during a previous substrate processing operation using a pattern recognition technique and stopping the substrate processing operation in response to a positive comparison; wherein said radiation reflected from upper substrate surface is generated from a broadband lamp.

9. A method for controlling operation of a substrate processing chamber, said method comprising:
    transferring a substrate into said substrate processing chamber;
    performing a substrate processing operation on said substrate disposed within said substrate processing chamber;
    measuring a plurality of wavelengths of radiation reflected from an upper surface of said substrate during said substrate processing operation; and
    comparing the measured wavelengths with wavelengths measured during a previous substrate processing operation using a pattern recognition technique; wherein said plurality of wavelengths of radiation are measured with a spectrometer.

10. A process for controlling a plasma etch operation, said process comprising:
    forming a plasma within a substrate processing chamber to etch a wafer disposed within the chamber;
    measuring a plurality of wavelengths of radiation reflected from an upper surface of a wafer being etched with a spectrometer; and
    comparing the measured wavelengths with wavelengths measured during a previous plasma etch operation using a pattern recognition technique; wherein said pattern recognition technique is principal component analysis.

11. A process for controlling a plasma etch operation, said process comprising:
    forming a plasma within a substrate processing chamber to etch a wafer disposed within the chamber;
    measuring a plurality of wavelengths of radiation reflected from an upper surface of a wafer being etched with a spectrometer; and
    comparing the measured wavelengths with wavelengths measured during a previous plasma etch operation using a pattern recognition technique; wherein said plasma etch operation is stopped in response to a positive comparison of said measured plurality of wavelengths to said previously measured wavelengths.

12. The process of claim 11 wherein said pattern recognition technique is a principal component analysis technique.

13. A process for controlling a plasma etch operation, said process comprising:

forming a plasma within a substrate processing chamber to etch a wafer disposed within the chamber;

measuring a plurality of wavelengths of radiation reflected from an upper surface of a wafer being etched with a spectrometer; and comparing the measured wavelengths with wavelengths measured during a previous plasma etch operation using a pattern recognition technique; wherein gas flows of said plasma etch operation are altered in response to a positive comparison of said measured plurality of wavelengths to said previously measured wavelengths.

14. The process of claim 13 wherein said pattern recognition technique is a principal component analysis technique.

15. An apparatus for processing a substrate, said apparatus comprising:

a substrate processing chamber;

a radiation collector operatively coupled to said substrate processing chamber to measure radiation reflected from an upper surface of said substrate during said substrate processing operation, said radiation collector being capable of measuring reflected radiation from a plurality of different radiation wavelengths;

a computer processor that controls the operation of said apparatus; and a memory coupled to said computer controller, said memory storing a computer program in computer readable format that includes computer instructions to control said apparatus to (1) perform a substrate processing operation on a substrate disposed within said substrate processing chamber, (2) compare measurements from said radiation collector to data representative of a plurality of wavelengths of radiation reflected off the surface of a substrate during a previous substrate processing operation using a pattern recognition technique, and (3) in response to a positive comparison, stop said substrate processing operation.

16. The apparatus of claim 15 wherein said radiation collector is a spectrometer.

17. The apparatus of claim 15 wherein said substrate processing chamber is a plasma etch chamber.

* * * * *